United States Patent [19]

Fujishige

[11] 4,051,271

[45] Sept. 27, 1977

[54] METHOD FOR FORMING IMAGES BY IRRADIATION OF ELECTRON RAYS AND RESIST COMPOSITIONS UTILIZABLE THEREFOR

[75] Inventor: Shoei Fujishige, Yokohama, Japan

[73] Assignee: Director-General of the Agency of Industrial Science and Technology, Japan

[21] Appl. No.: 668,046

[22] Filed: Mar. 18, 1976

[30] Foreign Application Priority Data

June 30, 1975 Japan .................................. 50-81323

[51] Int. Cl.$^2$ ............................................... B05D 3/06
[52] U.S. Cl. ........................................ 427/43; 96/35.1; 96/36.2; 96/115 R; 204/159.22; 427/44; 427/273
[58] Field of Search ................... 427/35, 43, 44, 273; 96/35.1, 36.2, 115 R; 204/159.22

[56] References Cited

U.S. PATENT DOCUMENTS

| 3,779,806 | 12/1973 | Gipstein et al. | 427/43 |
| 3,934,057 | 1/1976 | Moreau et al. | 427/43 |

Primary Examiner—John H. Newsome
Attorney, Agent, or Firm—Cooper, Dunham, Clark, Griffin & Moran

[57] ABSTRACT

Syndiotactic poly(methyl methacrylate) obtained by radical polymerization is mixed with isotactic poly(methyl methacrylate) obtained by anionic polymerization so that the ratio by weight of the syndiotactic component to the isotactic component is from 2:8 to 8:2 and the mixture is dissolved homogeneously in a non-polar solvent such as benzene or toluene. The resist composition thus obtained is applied onto a substrate to form a photosensitive element which is then exposed to electron rays to cause depolymerization of the polymer in the exposed areas and developed with an organic solvent to form an image which is excellent in contrast and resolving power and devoid of pinholes.

11 Claims, No Drawings

METHOD FOR FORMING IMAGES BY IRRADIATION OF ELECTRON RAYS AND RESIST COMPOSITIONS UTILIZABLE THEREFOR

BACKGROUND OF THE INVENTION

The present invention relates to a method for forming images by irradiation of electron rays and to a novel resist composition utilizable for the method. More particularly, the present invention relates to a method for forming images wherein a stereocomplex of poly(methyl methacrylate) is used as sensitivve material and subjected to an image-forming exposure treatment under irradiation of electron rays and thereafter the exposed material is developed with an organic solvent, and to a new resist composition utilizable for the method.

The use of poly(methyl methacrylate) is already known to form a resist capable of affording a positive image when subjected to irradiation of electron rays.

In case poly(methyl methacrylate) is used as a resist for forming images by irradiation of electron rays, a 5–10% solution of this polymer is first prepared and applied onto a substrate such as a silicon oxide panel to form a thin film of 0.3–0.5 $\mu$ in thickness. The thin film is then exposed to irradiation of electron rays through a desired original whereby poly(methyl methacrylate) in the exposed areas is decomposed to a low molecular compound. A desired positive image is formed when the exposed thin film is washed with a proper organic solvent as developer to wash off the low molecular compound thereby attaining development.

However, the poly(methyl methacrylate) which has been used previously is a mixture of methyl methacrylate polymers having different molecular weights containing low molecular polymers. On development of the exposed material, therefore, not only the low molecular weight compounds produced in exposed areas but also those contained in unexposed areas are washed off with a developing solvent, thus causing the formation of pinholes. This is one of the detrimental imperfections in the resist.

To overcome these drawbacks in the prior art method using poly(methyl methacrylate), a process has been proposed wherein poly(methyl methacrylate) is dissolved homogeneously in a good solvent and a poor solvent or a non-solvent for the polymer is added in small portions to the solution to effect separation of phases for removing low molecular weight components in the starting material. Another proposal is the use of a process wherein a combination of a good solvent and a poor solvent or non-solvent which have been properly mixed to a desired dissolving power is used on development to wash off only the low molecular weight compounds formed by decomposition of the polymer at the time of irradiation by electron rays.

In the use of such mixed solvent, however, the good solvent alone tends to separate from the other solvent and become selectively adsorbed to the poly(methyl methacrylate) layer, thus making it difficult to eliminate the low molecular weight components effectively. Therefore, these previous procedures have not been completely satisfactory due to the formation of pinholes, reduction in processing accuracy, reduction in resolving power of the resist and lack of clarity of image lines.

In order to overcome the above mentioned deficiencies, it has now been found in accordance with this invention that when syndiotactic poly(methyl methacrylate) obtained by a usual radical polymerization is mixed with poly(methyl methacrylate) obtained by anionic polymerization and containing a large proportion of polymer of isotactic structure, or with poly(methyl methacrylate) having isotactic and syndiotactic polymer blocks, a stereocomplex of the polymer is formed having extremely low solubility in organic solvents used in the developing treatment; and that when the stereocomplex is exposed to irradiation of electron rays, it is easily decomposed to form low molecular weight compounds soluble in the organic solvent.

BRIEF SUMMARY OF THE INVENTION

In accordance with the present invention, there is provided a method for forming images, characterized by applying onto a substrate a thin film of a stereocomplex composed of syndiotactic poly(methyl methacrylate) obtained by radical polymerization and poly(methyl methacrylate) obtained by anionic polymerization and containing the isotactic structure, exposing the thin film to electron rays through an original to form a latent image on the film and then developing it with an organic solvent.

In accordance with the present invention, there is also provided a resist composition utilizable for the method for forming images by irradiation with electron rays which comprises a non-polar solvent having dissolved therein, in a selected proportion, syndiotactic poly(methyl methacrylate) obtained by radical polymerization and poly(methyl methacrylate) obtained by anionic polymerization and containing the isotactic structure.

It is an object of the invention to provide a method to form pinhole free images of high quality utilizing a specific resist composition.

It is another object of the invention to provide a method of forming images manifesting excellent contrast and reproducibility of precise patterns.

It is still another object of the invention to provide a resist material capable of affording images of high quality, pinhole free images by irradiation with electron rays.

It is further object of the invention to provide a resist material capable of affording images manifesting excellent contrast and reproducibility of precise patterns.

It is still further object of the invention to provide a resist composition capable of affording images by irradiation with electron rays, which are pinhole free and manifest excellent contrast and reproducibility/

Other and further objects, features and advantages of the present invention will appear more fully from the following description.

DETAILED DESCRIPTION OF THE INVENTION

In the present invention, syndiotactic poly(methyl methacrylate) obtained by radical polymerization and poly(methyl methacrylate) obtained by anionic polymerization and containing the isotactic structure are used in such proportion that the ratio by weight of the syndiotactic component to the isotactic component is from 2:8 to 8:2. In respect of stereoconfiguration, poly(methyl methacrylate) obtained by radical polymerization is syndiotactic. In the present invention, poly(methyl methacrylate) obtained by radical polymerization may have an average molecular weight of 20,000 to 1 and that obtained by anionic polymerization has a molecular weight from 10,000 to several hundred thousand.

Poly(methyl methacrylate) obtained by anionic polymerization and containing the isotactic structure does not mean that they have only the isotactic structure, but that there is a high proportion of isotactic structure, or that isotactic and syndiotactic polymer blocks are present. This polymer usually has an average molecular weight of about 10000 or more.

The resist composition is prepared by mixing the syndiotactic component with the isotactic component in a ratio by weight of 2:8 to 8:2 and then dissolving the mixture homogeneously in a non-polar solvent, for example, an organic solvent containing predominantly an aromatic hydrocarbon such as benzene or toluene. If the proportion of the syndiotactic or isotactic component exceeds the above range, the formation of the stereocomplex becomes insufficient and high quality images cannot be obtained. A preferable proportion of the syndiotactic component to the isotactic component is within a range from 1:3 to 3:1.

The non-polar solvent is not limited to a single non-polar solvent but may be a mixed solvent in which a non-polar solvent is mixed with a polar organic solvent having a higher boiling point such as methyl isopropyl ketone. No limitation exists in the concentration of the polymer in the solution. Usually, however, a concentration within a range from 5 to 20 % is employed.

The resist composition is applied onto the surface of a given substrate and the solvent is removed to form a thin film of 0.2–1.0 µ in thickness prior to actual use.

The poly(methyl methacrylate) used in the present invention is preferably subjected at least once to a molecular weight-fractionating treatment which is carried out, for example, in the following manner: Poly(methyl methacrylate) having a molecular weight of $1 \times 10^4 - 1 \times 10^7$ is dispersed into an organic solvent which, when the polymer is dissolved, shows a theta temperature ($\theta$ temperature) from 25° C and 45° C. The polymer is dissolved in the solvent by heating and the solution is then cooled by allowing it to stand. A high molecular substance suitable as a resist for exposure to electron rays is obtained by separating and collecting the precipitated flaky solid.

Examples of the organic solvent which shows a definite theta temperature are shown in the following table.

| Solvents | Theta temperatures |
|---|---|
| Carbon tetrachloride | 27° C |
| 3-Heptanone | 25° C |
| 4-Heptanone | 35 – 40° C |
| Acetonitrile | 30° C |
| Chlorbutane | 33° C |
| Amyl acetate | 41° C |

In the molecular weight-fractionating treatment, the poly(methyl methacrylate) is dissolved entirely in the organic solvent by heating and the solution is then allowed to to stand for cooling. In this case, the organic solvent is used conveniently in an amount of 10–100 parts by weight per part by weight of the poly(methyl methacrylate).

As the temperature of the solution drops, the high molecular weight component of the poly(methyl methacrylate) once dissolved is phase separated as flaky substance, while the low molecular weight component remains in the solution. The precipitated substance is collected and used as a resist for exposure to an electron beam.

The poly(methyl methacrylate) used in the present invention may be subjected, prior to actual use, to a partial hydrolysis treatment conducted in a usual manner for improving adhesiveness to the substrate.

In the present invention, a thin film of the stereocomplex of poly(methyl methacrylate) is applied onto a substrate, exposed to irradiation by electron rays through a selected original to form a latent image and then treated with a developer solution. The solution is any typical mixed solvent used for developing prior art resists. A mixture of a ketone such as acetone or methyl ethyl ketone and an alcohol such as isopropyl alcohol or methanol, may be employed. The latent image is washed off and a positive high quality image which is substantially devoid of pinholes and has high contrast is obtained. The irradiation dosage selected will be sufficient to print the original image on the resist. It varies according to the thickness of a thin film of the stereocomplex, but is usually from $10^{-5} - 10^{-6}$ coulomb/cm$^2$.

According to the present invention, syndiotactic poly(methyl methacrylate) obtained by usual radical polymerization is mixed with poly(methyl methacrylate) obtained by anionic polymerization containing a high prepartion of isotactic structure or having syndiotactic and isotactic polymer blocks. This polymer mixture is used as a material for the resist.

In the majority of polar solvents, a peculiar intermolecular force acts between the different steroconfiguration units seen in the micro structure of the poly(methyl methacrylate) is considerably lowered. Thus, a thin film of the mixed polymers formed on the surface of a substrate by dissolving a mixture of the polymers in such mixing ratio in an organic solvent hardly capable of forming a stereocomplex, for example, benzene or toluene to form a homogeneous solution and then subjecting the solution to a film-forming treatment on the surface of the substrate shows much lower solubility in organic solvents than that shown by the individual poly(methyl methacrylate) before mixing. When the thin film of a mixture of the polymers is exposed according to the present invention to irradiation of electron rays through a given original to form a latent image, the area of the film where the latent image is formed is decomposed (depolymerized) to low molecular weight compounds and the structure of "stereocomplex" formed between the molecules of poly(methyl methacrylate) having at least two different stereo configurations can no longer be maintained. As a result, there is a great difference in solubility of the polymers in specific organic solvents used as developers between the area where the latent image is formed and the other area. Thus, the thin film of a mixture of the polymer gives a resist bearing positive images with high contrast.

The present invention provides resists suitable for commercial production of high quality, reproducible images.

To further illustrate the present invention, and not by way of limitation, the following examples are given.

EXAMPLE 1

In 10 ml of benzene were dissolved 0.35 g of poly(methyl methacrylate) having a viscosity-average molecular weight of 220,000 which had been prepared by a usual radical polymerization and once subjected to a molecular weight-fractionating treatment using benzene and n-hexane and 0.3 g of isotactic poly(methyl methacrylate) having a viscosity-average molecular weight of 570,000 which had been prepared by anionic polymerization in the presence of lithium aluminum hydride as initiator and once subjected to a molecular weight-fractionating treatment using benzene and n-hexane. The homogeneous solution was filtered to remove any insoluble contaminant.

The resist solution thus prepared was applied by a standard spin method onto the surface of a silicon oxide substrate to form a thin film of 0.3–0.5 μ in thickness. The thin film was exposed to irradiation of electron rays through an original to print a latent image in the film and then developed with a mixture (1:3 in volume ratio) of acetone and isopropyl alcohol whereby the exposed areas were washed off. A positive image of high quality free of any pinhole was thus obtained.

EXAMPLE 2

Flaky poly(methyl methacrylate) having a viscosity-average molecular weight of 220,000 which had been prepared by a usual radical polymerization and once subjected to a molecular weight-fractionating treatment using benezene and n-hexane was dried and treated at 30° C for about one hour with a 70 % aqueous solution of sulfuric acid to effect partial hydrolysis of the polymer. The flaky polymer thus treated was washed with water until acidity was no longer detected in the washings and then dried under reduced pressure.

In 10 ml of a solvent mixture (3:1 in volume ratio) of benzene and methyl isopropyl ketone were dissolved 0.35 g of the partially hydrolyzed poly(methyl methacrylate) thus obtained and 0.4 g of poly(methyl methacrylate) having a viscosity-average molecular weight of 140,000 and composed of the isotactic and syndiotactic polymer blocks which had been prepared by anionic polymerization using phenylmagnesium bromide as initiator and once subjected to a molecular weight-fractionating treatment using benzene and n-hexane. The homogeneous solution was filtered to remove any insoluble contaminant.

The resist solution thus obtained was applied by a standard spin method onto the surface of a silicon oxide substrate to form a thin film of 0.3–0.5 μ in thickness. The film film was exposed to irradiation of electron rays through a given original to print a latent image in the silm and then devveloped with a mixture (1:3 in volume ratio) of methyl ethyl ketone and isopropyl alcohol whereby improvement in adhesiveness of the remaining film to the substrate was observed. A positive image of high quality free of any pinhole was thus obtained.

What is claimed is:

1. A method for forming images characterized by applying onto a substrate a thin film of a sterocomplex composed of syndiotactic poly(methyl methacrylate) obtained by radical polymerization and poly(methyl methacrylate) obtained by anionic polymerization and containing the isotactic structure, exposing said thin film to irradiation by electron rays through an original to effect depolymerization of the polymer in the exposed areas and thereafter washing off the depolymerized substance with an organic solvent.

2. A method according to claim 1 wherein said stereocomplex is composed of said syndiotactic poly(methyl methacrylate) and said poly(methyl methacrylate) containing the isotactic structure in such proportion that the ratio by weight of said syndiotactic component to said isotactic component is from 2:8 to 8:2.

3. A method according to claim 1 wherein said stereocomplex is composed of said syndiotactic poly(methyl methacrylate) having an average molecular weight of 20,000–1 million and of said poly(methyl methacrylate) having the isotactic structure and an average molecular weight from 10,000 to several hundred thousand.

4. A method according to claim 1 wherein said syndiotactic poly(methyl methacrylate) and said poly(methyl methacrylate) having the isotactic structure are dissolved in said non-polar solvent and applied onto said substrate and thereafter said solvent is removed to form a thin film of said stereocomplex on the substrate.

5. A method according to claim 1 wherein the dose of electron rays is from $10^{-5}$–$10^{-6}$ coulomb/cm$^2$.

6. A method according to claim 1 wherein said organic solvent is a mixture of a ketone and an alcohol.

7. A resist material capable of affording images by irradiation with electron rays which comprises a substrate coated with a thin film of a stereocomplex composed of syndiotactic poly(methyl methacrylate) obtained by radical polymerization and poly(methyl methacrylate) obtained by anionic polymerization and having the isotactic structure in a ratio by weight of 2:8 to 8:2.

8. A resist material according to claim 7 wherein said stereocomplex is composed of said syndiotactic poly(methyl methacrylate) having an average molecular weight of 20,000–1 million and of said poly(methyl methacrylate) having the isotactic structure and an average molecular weight within a range from 10,000 to several hundred thousand.

9. A resist composition capable of affording images by irradiation with electron rays which comprises a non-polar solvent having dissolved therein syndiotactic poly(methyl methacrylate) obtained by radical polymerization and poly(methyl methacrylate) obtained by anionic polymerization and having the isotactic structure in such proportion that the ratio by weight of the syndiotactic component to the isotactic component is from 2:8 to 8:2.

10. A resist composition according to claim 9 wherein said syndiotactic poly(methyl methacrylate) has an average molecular weight of 20,000–1 million and said poly(methyl methacrylate) having the isotactic structure has an average molecular weight from 10,000 to several hundred thousand.

11. A resist composition according to claim 9 wherein both poly(methyl methacrylates) have been subjected to a molecular weight-fractionating treatment.

* * * * *